United States Patent [19]

Takeuchi et al.

[11] 4,243,541

[45] Jan. 6, 1981

[54] PIEZOELECTRIC CERAMICS

[75] Inventors: Hiroshi Takeuchi, Matsudo; Yukio Ito, Kokubunji; Shigeru Jyomura, Hachioji; Kunio Yamashita, Hachioji; Kazuyuki Nagatsuma, Hachioji; Sakichi Ashida, Fuchu; Mitsuru Ishii, Higashi-yamato, all of Japan

[73] Assignee: Hitachi, Ltd., Japan

[21] Appl. No.: 940,219

[22] Filed: Sep. 6, 1978

[30] Foreign Application Priority Data

Sep. 7, 1977 [JP] Japan .................. 52-106606
Sep. 7, 1977 [JP] Japan .................. 52-106607

[51] Int. Cl.³ .............................. C04B 35/46
[52] U.S. Cl. ................................. 252/62.9
[58] Field of Search ......................... 252/62.9

[56] References Cited

U.S. PATENT DOCUMENTS 3,502,913  3/1970  Osada ..................... 252/62.9
3,642,637  2/1972  Iregami et al. ............ 252/62.9

FOREIGN PATENT DOCUMENTS 47-17061   5/1972  Japan ..................... 252/62.9
47-48717  12/1972  Japan ..................... 252/62.9
48-12356   4/1973  Japan ..................... 252/62.9
51-9159    3/1976  Japan ..................... 252/62.9

*Primary Examiner*—Jack Cooper
*Attorney, Agent, or Firm*—Craig & Antonelli

[57] ABSTRACT

Piezoelectric ceramics containing PbO and $TiO_2$ as its principal constituents, and further containing 0.5 to 3.7 mol-% of $Nd_2O_3$ and 0.2 to 1.5 mol-% of $MnO_2$. Since the piezoelectric ceramics is low in the dielectric constant and is especially small in the temperature coefficient of the delay of surface acoustic waves, it is suitable for a surface acoustic wave device. Piezoelectric ceramics in which 0.3 to 3.3 mol-% of $In_2O_3$ is further added to the above-mentioned composition has a still smaller temperature coefficient of the delay of surface acoustic waves, and it is also possible to make this coefficient zero.

1 Claim, No Drawings

PIEZOELECTRIC CERAMICS

BACKGROUND OF THE INVENTION (i) Field of the Invention

This invention relates to piezoelectric ceramics which are used for ultrasonic vibrators, ceramic filters, surface acoustic wave devices, etc. The piezoelectric ceramics are especially used for the surface acoustic wave devices.

(ii) Brief Description of the Prior Art

As the piezoelectric ceramics of this type, there have heretofore been well known the so-called PZT type piezoelectric ceramics which contain lead zirconium titanates ($PbZr_{1-x}Ti_xO_3$) as the principal constituents and the so-called SPN type piezoelectric ceramics which contain sodium-potassium niobates ($K_{1-x}Na_xNbO_3$) as the principal constituents. Regarding the PZT type ceramics, ones which are considerably excellent in both the piezoelectric property and the temperature characteristics have been obtained by adding third constituents such as $Pb(Mg_{1/3}Nb_{2/3})O_3$ and $Pb(Mn_{1/3}Nb_{2/3})O_3$ to the principal constituents. Since, however, they are essentially ceramics of high dielectric constants (400–1,500), the input and output impedances of devices lower in high-frequency uses, which poses a problem in the impedance matching with an external circuit. In particular, the frequencies of piezoelectric transducers have recently become higher and higher, and it has become an important subject to lower the dielectric constants. On the other hand, the SPN type ceramics have the feature that the dielectric constants are small (150–200). However, they have the disadvantages that the electromechanical coupling factors are not sufficiently great and that the temperature characteristics are very inferior.

The following references are cited to show the state of the art: (i) Japanese Patent Application Publication No. 42-4023, (ii) S. Ikegami et al; The Journal of the Acoustical Society of America, vol. 50, No. 4 (1971), pp. 1060–1066.

SUMMARY OF THE INVENTION

An object of this invention is to provide piezoelectric ceramics which endures use at a high frequency and which is excellent in temperature characteristics, especially, small in the temperature coefficient of delay of surface acoustic waves.

Various characteristics desired for piezoelectric ceramics for a variety of devices, particularly a surface acoustic wave device, will be described below.

Dielectric constant $\epsilon$: The dielectric constant concerns the magnitudes of the input and output impedances of a device. When the dielectric constant is great, the impedances lower conspicuously in case of using the device at a high frequency. For example, in case of using the device at the intermediate frequency of television (57 MHz), it is desirable that the dielectric constant is 300 or less.

Electromechanical coupling factor $k_t$: This factor concerns the specific bandwidth and the insertion loss of a device. In case of employing the piezoelectric ceramics for a transducer etc., it is desirable that the factor $k_t$ is 40% or above.

Mechanical quality factor $Q_M$: Particularly in case of employing the piezoelectric ceramics for the surface acoustic wave device, the factor $Q_M$ needs to be high in order to reduce the propagation loss, and it is desirable that the factor $Q_M$ is 1,000 or greater.

Electromechanical coupling factor for surface acoustic waves $k_s^2$: This factor concerns the specific bandwidth and the insertion loss of the surface acoustic wave device. For example, in case of using the piezoelectric ceramics for a wide band-pass filter which has a specific bandwidth of 10% or above, it is desirable that the factor $k_s^2$ is 1% or above.

Propagation loss: A high propagation loss forms a cause for increasing the insertion loss of the surface acoustic wave device. For example, in case of using the piezoelectric ceramics for a filter of a 60 MHz band, it is desirable that the propagation loss is 10 dB/cm or less in this frequency band.

Temperature coefficient of delay for surface acoustic waves: This coefficient is a criterion for the temperature stability of the frequency characteristics of the surface acoustic wave device. A smaller coefficient is more desirable.

Temperature coefficient of a frequency constant: This is a quantity which indicates the temperature stability of radial vibrations. In a device exploiting the radial vibrations such as low-frequency filter, it is more desirable that this value is smaller. However, when the piezoelectric ceramics is used for the surface acoustic wave device, this quantity need not be especially considered.

Electric resistance: When the electric resistance is low, the poling becomes difficult, and effectively the electromechanical coupling factors ($k_t$, $k_s^2$) lower. It is desirable that the piezoelectric ceramics has a specific resistance equal to or higher than approximately $10^{11}$ at the room temperature.

However, the above desirable values are shown as only a measure for a specific purpose, and, accordingly, the piezoelectric ceramics of the present invention can be employed even when one of the above characteristics is somewhat inferior.

In order to accomplish the object mentioned previously, the piezoelectric ceramics of this invention contains lead oxide PbO and titanium oxide $TiO_2$ as its principal constituents, to which 0.5 to 3.7 mol-% of neodymium oxide $Nd_2O_3$ and 0.2 to 1.5 mol-% of manganese dioxide $MnO_2$ are added together. The piezoelectric ceramics of this invention becomes extraordinarily dense and excellent in the piezoelectric property by appropriately selecting the compounding composition. Especially, it has the feature that as the quantity of addition of $Nd_2O_3$ is increased, the temperature characteristics are remarkably improved. Moreover, the mechanical quality factor is as large as 1,500 to 3,000 and the grain size is as very small as about 1 μm, so that the propagation loss of surface acoustic waves is 4 to 7 dB/cm at 60 MHz, this value being so small as has never been attained as the propagation loss of piezoelectric ceramics. In addition, since the piezoelectric ceramics of this invention is low dielectric constant (170 to 400) ceramics, it is excellent piezoelectric ceramics for a surface acoustic wave device which especially endures use at high frequencies.

The composition range exhibiting the aforecited excellent properties consisted of PbO; 42.5 to 49.3 mol-%, $TiO_2$; 48.7 to 53.6 mol-%, $Nd_2O_3$; 0.5 to 3.7 mol-%, $MnO_2$; 0.2 to 1.5 mol-%, and very small quantities of inevitable impurities. Outside this composition range, any property degraded. Regarding PbO, when the content exceeded 49.3 mol-%, the grain growth in a sintering process became drastical to produce ceramics of large propagation loss of surface acoustic waves. Conversely, when the content was smaller than 42.5 mol-%, the piezoelectric property degraded noticeably. Regarding $TiO_2$, contrariwise to the case of PbO, when the content was smaller than 48.7 mol-%, ceramics of large propagation loss was produced, and when the content was greater than 53.6 mol-%, the piezoelectric property degraded. Regarding $Nd_2O_3$, as the quantity of addition increased, the ceramics became denser and much better in the temperature characteristics. However, when the content exceeded 3.7 mol-%, the electric resistance of the ceramics lowered and the poling became difficult, so that effectively the piezoelectric property degraded and that the dielectric constant exceeded 400. On the other hand, in case where the quantity of $Nd_2O_3$ was smaller than 0.5 mol-%, ceramics with many pores was produced, and the propagation loss of surface acoustic waves increased. Regarding $MnO_2$, with increase in the quantity of addition, the mechanical quality factor increased, and ceramics of lower propagation loss was produced. However, when the quantity of addition exceeded 1.5 mol-%, the electric resistance of the ceramics decreased abruptly and the piezoelectric property degraded effectively. It was in case of adding $MnO_2$ at least 0.2 mol-% that an apparent increase of the mechanical quality factor was noted.

As stated above, the piezoelectric ceramics of this invention comprises lead oxide PbO and titanium oxide $TiO_2$ as its principal constituents, to which 0.5 to 3.7 mol-% of neodymium oxide $Nd_2O_3$ and 0.2 to 1.5 mol-% of manganese dioxide $MnO_2$ are added together. By further adding 0.3 to 3.3 mol-% of indium oxide $In_2O_3$ thereto, piezoelectric ceramics of more excellent characteristics can be obtained. More specifically, a very excellent piezoelectric property is exhibited by properly selecting the compounding ratios of the respective constituents. Especially, the temperature coefficient of the delay of surface acoustic waves becomes noticeably lower as the quantities of addition of $Nd_2O_3$ and $In_2O_3$ are made larger, and even the zero temperature coefficient can be realized. Moreover, since the mechanical quality factor is large and the pore diameter as well as the grain diameter is small, the propagation loss of surface acoustic waves is extraordinarily low as piezoelectric ceramics (4 to 7 dB/cm at 60 MHz). In addition, since the ceramics is as low as 200 to 300 in the dielectric constant, it is a more excellent material for a surface acoustic wave device which especially endures use at high frequencies.

The composition range of the ceramics containing $In_2O_3$ as exhibited the aforecited excellent properties consisted of PbO; 42.7 to 49.5 mol-%, $TiO_2$; 45.2 to 53.1 mol-%, $Nd_2O_3$; 0.5 to 3.7 mol-%, $In_2O_3$; 0.3 to 3.3 mol-%, $MnO_2$; 0.2 to 1.5 mol-%, and very small quantities of inevitable impurities. Outside this composition range, any of the properties degraded. When the quantity of PbO was smaller than 42.7 mol-%, the precipitation of $TiO_2$, $In_2O_3$ etc. appeared to produce ceramics with many pores, and the piezoelectric property degraded. On the other hand, when it was larger than 49.5 mol-%, the grain growth in a sintering process became drastical to produce ceramics of large propagation loss. Conversely, when the quantity of $TiO_2$ was larger than 53.1 mol-%, the piezoelectric property degraded, and when it was smaller than 45.2 mol-%, ceramics of large propagation loss was produced. Regarding $Nd_2O_3$, as the quantity of addition increased, the ceramics became denser and smaller in the temperature coefficient of the delay of surface acoustic waves. However, when it exceeded 3.7 mol-%, the electric resistance of the ceramics lowered, so that the poling became difficult and that the piezoelectric property degraded. In this case, the Curie point lowered and the dielectric constant exceeded 300. On the other hand, when the quantity of $Nd_2O_3$ was smaller than 0.5 mol-%, the number of pores increased, and ceramics of high propagation loss was produced. Regarding $In_2O_3$, with increase in the quantity of addition, the temperature coefficient of the delay of surface acoustic waves decreased, and the piezoelectric property was enhanced. However, when the quantity of addition exceeded 3.3 mol-%, the precipitation of $In_2O_3$ appeared, and the grain size became large to increase the propagation loss. It was in case of adding $In_2O_3$ at least 0.3 mol-% that apparent improvements in the temperature characteristics and the piezoelectric property were noted. Regarding $MnO_2$, as in the foregoing case where $In_2O_3$ was not added, the mechanical quality factor increased and the propagation loss decreased with increase in the quantity of addition, and since the electric resistance lowered noticeably beyond a quantity of addition of 1.5 mol-%, the poling became difficult and the piezoelectric property degraded. It was in case of adding $MnO_2$ at least 0.2 mol-% that an apparent increase of the mechanical quality factor was noted.

DESCRIPTION OF THE PRESENTLY PREFERRED EMBODIMENTS

EXAMPLES 1-19

Table 1 indicates the compositions and characteristics of ceramics in Examples 1-19 and Reference Examples 1-8. These examples and reference examples relate to the piezoelectric ceramics in the case where $In_2O_3$ was not added.

Raw material powders at composition ratios in a range specified in each example of Table 1 were mixed in distilled water with a pot mill for about 1 hour. After drying the mixture, it was pre-sintered at 850° C. for 2 hours. The pre-sintered compact was pulverized with a pulverizer, and the powdery mixture was mixed with the pot mill again. After drying, the mixture was press-molded under a pressure of 350 kg/cm$^2$ and sintered at 1,200°-1,260° C. for 5 hours. The pellet size after the sintering was 16 mm (in diameter)×2 mm (in thickness). After the pellet was polished to a thickness of approximately 1 mm, Cr-Au layers were evaporated on both the surfaces thereof as electrodes, and copper lead wires were attached to the electrodes with a silver paste. The poling was carried out at a poling field of 40-70 kV/cm and a poling temperature of 150° C. for about 10 minutes. Thereafter, the dielectric and piezoelectric characteristics etc. were measured. Further, one surface of the sample was polished into a mirror surface, and an interdigital electrode made of aluminum Al was formed thereon by the well-known photoetching process. Thereafter, the surface acoustic wave characteristics were measured.

The piezoelectric property was assessed by the transmission method in conformity with the IRE standards.

TABLE 1

| | Composition | Electric resistance $\rho$ ($\Omega \cdot cm$) | Dielectric constant $\epsilon_{33}T$ | Electro-mechanical coupling factor $k_t$ (%) | Temperature coefficient of frequency constant (ppm/°C.) | Mechanical quality factor $Q_M$ | Coupling factor for surface acoustic waves $k_s^2$ (%) | Temperature coefficient of delay of surface acoustic waves (ppm/°C.) | Propagation loss of surface acoustic waves (dB/cm, 60 MHz) |
|---|---|---|---|---|---|---|---|---|---|
| Ex. 1 | 48.9 PbO / 50.1 $TiO_2$ / 0.5 $Nd_2O_3$ / 0.5 $MnO_2$ | $2 \times 10^{12}$ | 165 | 48.5 | −60 | 1970 | 2.0 | 61 | 7.2 |
| Ex. 2 | 48.0 PbO / 50.5 $TiO_2$ / 1.0 $Nd_2O_3$ / 0.5 $MnO_2$ | $1.5 \times 10^{12}$ | 178 | 48.0 | −46 | 1730 | 2.0 | 49 | 6.6 |
| Ex. 3 | 46.9 PbO / 51.1 $TiO_2$ / 1.5 $Nd_2O_3$ / 0.5 $MnO_2$ | $1 \times 10^{12}$ | 205 | 48.9 | −21 | 1560 | 2.2 | 41 | 5.8 |
| Ex. 4 | 45.8 PbO / 51.6 $TiO_2$ / 2.1 $Nd_2O_3$ / 0.5 $MnO_2$ | $7 \times 10^{11}$ | 240 | 49.8 | 0 | 1320 | 2.4 | 30 | 5.2 |
| Ex. 5 | 44.7 PbO / 52.2 $TiO_2$ / 2.6 $Nd_2O_3$ / 0.5 $MnO_2$ | $4 \times 10^{11}$ | 290 | 49.1 | 16 | 1150 | 2.2 | 26 | 5.2 |
| Ex. 6 | 43.7 PbO / 52.6 $TiO_2$ / 3.2 $Nd_2O_3$ / 0.5 $MnO_2$ | $2 \times 10^{11}$ | 345 | 47.8 | 29 | 1020 | 1.9 | 21 | 5.8 |
| Ex. 7 | 42.6 PbO / 53.2 $TiO_2$ / 3.7 $Nd_2O_3$ / 0.5 $MnO_2$ | $2 \times 10^{11}$ | 400 | 45.5 | 37 | 980 | 1.1 | 18 | 6.8 |
| Ex. 8 | 48.0 PbO / 50.0 $TiO_2$ / 1.0 $Nd_2O_3$ / 1.0 $MnO_2$ | $3 \times 10^{11}$ | 173 | 46.5 | −38 | 2150 | 1.4 | 70 | 7.4 |
| Ex. 9 | 46.9 PbO / 50.6 $TiO_2$ / 1.5 $Nd_2O_3$ / 1.0 $MnO_3$ | $2 \times 10^{11}$ | 200 | 46.0 | −10 | 2020 | 1.4 | 46 | 4.8 |
| Ex. 10 | 45.8 PbO / 51.1 $TiO_2$ / 2.1 $Nd_2O_3$ / 1.0 $MnO_2$ | $1.5 \times 10^{11}$ | 235 | 45.0 | 8 | 1890 | 1.1 | 40 | 4.0 |
| Ex. 11 | 44.7 PbO / 51.7 $TiO_2$ / 2.6 $Nd_2O_3$ / 1.0 $MnO_2$ | $1 \times 10^{11}$ | 280 | 43.8 | 22 | 1710 | 0.9 | 36 | 4.9 |
| Ex. 12 | 43.7 PbO / 52.1 $TiO_2$ / 3.2 $Nd_2O_3$ / 1.0 $MnO_2$ | $8 \times 10^{10}$ | 330 | 43.1 | 34 | 1540 | 0.9 | 30 | 5.5 |
| Ex. 13 | 42.5 PbO / 52.8 $TiO_2$ / 3.7 $Nd_2O_3$ / 1.0 $MnO_2$ | $6 \times 10^{10}$ | 395 | 42.4 | 45 | 1200 | 0.8 | 25 | 6.5 |
| Ex. 14 | 45.8 PbO / 50.6 $TiO_2$ / 2.1 $Nd_2O_3$ / 1.5 $MnO_2$ | $7 \times 10^{10}$ | 245 | 42.0 | 9 | 2080 | 0.8 | 48 | 4.9 |
| Ex. 15 | 44.7 PbO / 51.2 $TiO_2$ / 2.6 $Nd_2O_3$ / 1.5 $MnO_2$ | $5 \times 10^{10}$ | 300 | 41.8 | 24 | 1890 | 0.7 | 40 | 6.3 |
| Ex. 16 | 49.3 PbO / 49.7 $TiO_2$ / 0.5 $Nd_2O_3$ / 0.5 $MnO_2$ | $2 \times 10^{12}$ | 162 | 48.0 | −63 | 1780 | 2.1 | 64 | 7.5 |
| Ref. Ex. 1 | 49.5 PbO / 49.5 $TiO_2$ / 0.5 $Nd_2O_3$ / 0.5 $MnO_2$ | $1 \times 10^{12}$ | 160 | 47.1 | −71 | 1410 | — | — | 19 |
| Ref. Ex. 2 | 42.3 PbO / 53.0 $TiO_2$ / 3.7 $Nd_2O_3$ / 1.0 $MnO_2$ | $8 \times 10^{10}$ | 398 | 38.1 | 47 | 980 | 0.2 | — | — |
| | 48.2 PbO / 48.7 $TiO_2$ | | | | | | | | |

TABLE 1-continued

| | Composition | Electric resistance $\rho$ ($\Omega \cdot$ cm) | Dielectric constant $\epsilon_{33}T$ | Electro-mechanical coupling factor $k_t$ (%) | Temperature coefficient of frequency constant (ppm/°C.) | Mechanical quality factor $Q_M$ | Coupling factor for surface acoustic waves $k_s^2$ (%) | Temperature coefficient of delay of surface acoustic waves (ppm/°C.) | Propagation loss of surface acoustic waves (dB/cm, 60 MHz) |
|---|---|---|---|---|---|---|---|---|---|
| Ex. 17 | 2.1 Nd$_2$O$_3$ 1.0 MnO$_2$ 48.4 PbO 48.5 TiO$_2$ | $9 \times 10^{10}$ | 251 | 44.2 | 11 | 1810 | 0.9 | 38 | 8.1 |
| Ref. Ex. 3 | 2.1 Nd$_2$O$_3$ 1.0 MnO$_2$ 42.5 PbO 53.6 TiO$_2$ | $9 \times 10^{10}$ | 248 | 44.5 | 8 | 1900 | — | — | 21 |
| Ex. 18 | 3.4 Nd$_2$O$_3$ 0.5 MnO$_2$ 42.5 PbO 53.8 TiO$_2$ | $2 \times 10^{11}$ | 367 | 41.8 | 33 | 1000 | 0.7 | 21 | 7.4 |
| Ref. Ex. 4 | 3.2 Nd$_2$O$_3$ 0.5 MnO$_2$ 41.7 PbO 53.3 TiO$_2$ | $1.5 \times 10^{11}$ | 352 | 38.8 | 29 | 950 | 0.2 | — | — |
| Ref. Ex. 5 | 4.0 Nd$_2$O$_3$ 1.0 MnO$_2$ 49.1 PbO 50.3 TiO$_2$ | $2 \times 10^{10}$ | 430 | 38.2 | 48 | 1010 | 0.2 | — | — |
| Ref. Ex. 6 | 0.3 Nd$_2$O$_3$ 0.3 MnO$_2$ 48.9 PbO 50.4 TiO$_2$ | $1.5 \times 10^{12}$ | 160 | 47.8 | −75 | 1230 | 1.7 | — | 18 |
| Ex. 19 | 0.5 Nd$_2$O$_3$ 0.2 MnO$_2$ 48.9 PbO 50.5 TiO$_2$ | $1 \times 10^{12}$ | 172 | 46.5 | −82 | 1060 | 1.5 | 70 | 7.6 |
| Ref. Ex. 7 | 0.5 Nd$_2$O$_3$ 0.1 MnO$_2$ 44.7 PbO 50.9 TiO$_2$ | $8 \times 10^{11}$ | 178 | 44.1 | −90 | 620 | 1.1 | 7.5 | 13.5 |
| Ref. Ex. 8 | 2.6 Nd$_2$O$_3$ 1.8 MnO$_2$ | $1 \times 10^{10}$ | 320 | 36.2 | 28 | 1940 | 0.1 | — | — |

As apparent from Examples 1 to 15, in the piezoelectric ceramics of this invention in which In$_2$O$_3$ is not added, the electromechanical coupling factor $k_s^2$ for surface acoustic waves has a value of 0.7–2.4%, and the propagation loss is 4–7 dB/cm in a 60 MHz band, this value being very small as piezoelectric ceramics. The temperature coefficient of delay decreases noticeably with increase in the quantity of addition of Nd$_2$O$_3$, and it becomes even less than 20 ppm/°C. as indicated in Example 7 by selecting the compounding composition. Also this value belongs to the smallest magnitude as piezoelectric ceramics. Besides, since the dielectric constant is as small as 160–400, the piezoelectric ceramics can endure use at a high frequency. That is, the piezoelectric ceramics of this invention has excellent properties having heretofore been unattainable as piezoelectric ceramics for a surface acoustic wave device even in case where In$_2$O$_3$ is not added.

In Example 16 and Reference Example 1, the content of PbO was made large. As indicated in Reference Example 1, when the content of PbO exceeded 49.3 mol-%, the grain growth in the sintering process became conspicuous, and the propagation loss of surface acoustic waves became large. Reference Example 2 corresponds to a case where conversely the content of PbO was made small. When the PbO content was less than 42.5 mol-%, the piezoelectric property degraded, and the coupling factors lowered noticeably. Example 17 and Reference Example 3 correspond to a case where the content of TiO$_2$ was made small, whereas Example 18 and Reference Example 4 correspond to a case where it was made large. When the content of TiO$_2$ was less than 48.7 mol-%, the grain size increased, and the propagation loss increased as indicated in Reference Example 3. When the content of TiO$_2$ exceeded 53.6 mol-%, the piezoelectric property degraded and the coupling factors became very small as indicated in Reference Example 4.

Reference Examples 5 and 6 correspond to cases where the quantities of addition of Nd$_2$O$_3$ were made large and small respectively. When the quantity of addition of Nd$_2$O$_3$ was increased up to 4.0 mol-%, the electric resistance of ceramics lowered down to $\sim 10^{10}$ $\Omega$·cm and the poling became difficult, so that the coupling factors lowered considerably as indicated in Reference Example 5. Conversely, when the quantity of addition of Nd$_2$O$_3$ became 0.3 mol-%, ceramics with many pores was produced, and the propagation loss increased as indicated in Reference Example 6.

Example 19 and Reference Examples 7 and 8 correspond to cases where the quantity of addition of MnO$_2$ was made small or large. When the quantity of addition was less than 0.2 mol-%, the lowering of the mechanical quality factor was conspicuous, and the propagation loss became large. On the other hand, when the quantity of addition was increased, the mechanical quality factor became large. However, when it exceeded 1.5 mol-%, the electric resistance of ceramics became as low as about $10^{10}$ $\Omega$·cm as indicated in Reference Example 8, and effectively the coupling factors lowered noticeably.

As explained above, the piezoelectric ceramics of this invention which contains 42.5 to 49.3 mol-% of PbO, 48.7 to 53.6 mol-% of $TiO_2$, 0.5 to 3.7 mol-% of $Nd_2O_3$ and 0.2 to 1.5 mol-% of $MnO_2$ has the excellent properties having hitherto been unattainable as piezoelectric ceramics especially for a surface acoustic wave device.

EXAMPLES 20–46

Table 2 indicates the compositions and characteristics of ceramics in Examples 20–46 and Reference Examples 9–20. These examples and reference examples relate to the piezoelectric ceramics in the case where $In_2O_3$ was added.

The piezoelectric ceramics were produced similarly to Example 1 except that the poling field was made 40–60 kV/cm and that the poling temperature was made 130°–140° C., and the characteristics were measured.

TABLE 2

| | | Characteristics | | | | | | |
|---|---|---|---|---|---|---|---|---|
| | Composition | Electric resistance $\rho(\Omega \cdot cm)$ | Dielectric constant $\epsilon_{33}^T$ | Electro-mechanical coupling factor $k_t$ (%) | Mechanical quality factor $Q_M$ | Coupling factor for surface acoustic waves $k_s^2$ (%) | Propagation loss of surface acoustic waves (dB/cm, 60 MHz) | Temperature coefficient of delay of surface acoustic waves (ppm/°C.) |
| Ex. 20 | 49.5 PbO<br>49.5 $TiO_2$<br>0.5 $Nd_2O_3$<br>0.3 $In_2O_3$<br>0.2 $MnO_2$ | $8 \times 10^{11}$ | 170 | 44.4 | 900 | 1.8 | 7.4 | 75 |
| Ex. 21 | 48.5 PbO<br>49.8 $TiO_2$<br>1.0 $Nd_2O_3$<br>0.5 $In_2O_3$<br>0.2 $MnO_2$ | $8 \times 10^{11}$ | 195 | 46.0 | 950 | 1.9 | 6.5 | 51 |
| Ex. 22 | 48.7 PbO<br>49.3 $TiO_2$<br>1.0 $Nd_2O_3$<br>0.8 $In_2O_3$<br>0.2 $MnO_2$ | $1 \times 10^{12}$ | 192 | 47.1 | 1050 | 1.9 | 7.0 | 44 |
| Ex. 23 | 47.5 PbO<br>50.3 $TiO_2$<br>1.5 $Nd_2O_3$<br>0.5 $In_2O_3$<br>0.2 $MnO_2$ | $4 \times 10^{11}$ | 200 | 45.5 | 960 | 1.8 | 5.5 | 40 |
| Ex. 24 | 47.7 PbO<br>49.7 $TiO_2$<br>1.5 $Nd_2O_3$<br>0.8 $In_2O_3$<br>0.3 $MnO_2$ | $7 \times 10^{11}$ | 196 | 46.3 | 1200 | 1.9 | 6.5 | 36 |
| Ex. 25 | 47.9 PbO<br>49.1 $TiO_2$<br>1.5 $Nd_2O_3$<br>1.0 $In_2O_3$<br>0.5 $MnO_2$ | $1 \times 10^{12}$ | 190 | 47.6 | 1340 | 2.1 | 7.0 | 30 |
| Ex. 26 | 46.4 PbO<br>50.5 $TiO_2$<br>2.1 $Nd_2O_3$<br>0.5 $In_2O_3$<br>0.5 $MnO_2$ | $8 \times 10^{11}$ | 211 | 46.5 | 1180 | 2.0 | 4.6 | 32 |
| Ex. 27 | 46.9 PbO<br>49.5 $TiO_2$<br>2.1 $Nd_2O_3$<br>1.0 $In_2O_3$<br>0.5 $MnO_2$ | $1 \times 10^{12}$ | 205 | 47.3 | 1340 | 2.2 | 4.2 | 28 |
| Ex. 28 | 47.4 PbO<br>48.4 $TiO_2$<br>2.1 $Nd_2O_3$<br>1.6 $In_2O_3$<br>0.5 $MnO_2$ | $1.5 \times 10^{12}$ | 203 | 48.5 | 1450 | 2.4 | 5.8 | 21 |
| Ex. 29 | 47.4 PbO<br>47.9 $TiO_2$<br>2.1 $Nd_2O_3$<br>1.6 $In_2O_3$<br>1.0 $MnO_2$ | $2 \times 10^{11}$ | 200 | 47.6 | 2000 | 2.2 | 5.0 | 24 |
| Ex. 30 | 45.3 PbO<br>51.0 $TiO_2$<br>2.7 $Nd_2O_3$<br>0.5 $In_2O_3$<br>0.5 $MnO_2$ | $6 \times 10^{11}$ | 259 | 45.0 | 970 | 1.8 | 6.8 | 28 |
| Ex. 31 | 45.8 PbO<br>49.6 $TiO_2$<br>2.6 $Nd_2O_3$<br>1.0 $In_2O_3$<br>1.0 $MnO_2$<br>46.3 PbO<br>48.5 $TiO_2$ | $1 \times 10^{11}$ | 242 | 44.5 | 1430 | 1.7 | 5.2 | 11 |

TABLE 2-continued

| | Composition | Electric resistance $\rho(\Omega \cdot cm)$ | Dielectric constant $\epsilon_{33}^T$ | Electro-mechanical coupling factor $k_t$ (%) | Mechanical quality factor $Q_M$ | Coupling factor for surface acoustic waves $k_s^2$ (%) | Propagation loss of surface acoustic waves (dB/cm, 60 MHz) | Temperature coefficient of delay of surface acoustic waves (ppm/°C.) |
|---|---|---|---|---|---|---|---|---|
| Ex. 32 | 2.6 $Nd_2O_3$<br>1.6 $In_2O_3$<br>1.0 $MnO_2$<br>46.8 PbO<br>47.5 $TiO_2$ | $2 \times 10^{11}$ | 235 | 45.1 | 1790 | 1.8 | 4.8 | 0 |
| Ex. 33 | 2.6 $Nd_2O_3$<br>2.1 $In_2O_3$<br>1.0 $MnO_2$<br>44.7 PbO<br>50.6 $TiO_2$ | $3 \times 10^{11}$ | 230 | 45.5 | 1850 | 1.9 | 6.2 | −3 |
| Ex. 34 | 3.2 $Nd_2O_3$<br>1.0 $In_2O_3$<br>0.5 $MnO_2$<br>45.2 PbO<br>49.6 $TiO_2$ | $6 \times 10^{11}$ | 271 | 43.2 | 980 | 1.2 | 7.0 | 8 |
| Ex. 35 | 3.1 $Nd_2O_3$<br>1.6 $In_2O_3$<br>0.5 $MnO_2$<br>45.7 PbO<br>48.1 $TiO_2$ | $8 \times 10^{11}$ | 262 | 44.0 | 1050 | 1.4 | 6.5 | 6 |
| Ex. 36 | 3.1 $Nd_2O_3$<br>2.1 $In_2O_3$<br>1.0 $MnO_2$<br>46.2 PbO<br>47.2 $TiO_2$ | $1 \times 10^{11}$ | 255 | 43.6 | 1580 | 1.2 | 6.5 | 2 |
| Ex. 37 | 3.0 $Nd_2O_3$<br>2.6 $In_2O_3$<br>1.0 $MnO_2$<br>44.1 PbO<br>50.1 $TiO_2$ | $2 \times 10^{11}$ | 250 | 44.0 | 1590 | 1.2 | 7.1 | −4 |
| Ex. 38 | 3.7 $Nd_2O_3$<br>1.6 $In_2O_3$<br>0.5 $MnO_2$<br>44.6 PbO<br>49.1 $TiO_2$ | $2 \times 10^{11}$ | 300 | 41.2 | 720 | 1.0 | 7.4 | 7 |
| Ex. 39 | 3.7 $Nd_2O_3$<br>2.1 $In_2O_3$<br>0.5 $MnO_2$<br>45.1 PbO<br>47.6 $TiO_2$ | $3 \times 10^{11}$ | 295 | 41.5 | 800 | 1.0 | 7.1 | 4 |
| Ex. 40 | 3.7 $Nd_2O_3$<br>2.6 $In_2O_3$<br>1.0 $MnO_2$<br>45.6 PbO<br>46.4 $TiO_2$ | $8 \times 10^{10}$ | 281 | 40.2 | 1100 | 0.9 | 6.5 | −1 |
| Ex. 41 | 3.7 $Nd_2O_3$<br>3.3 $In_2O_3$<br>1.0 $MnO_2$<br>49.8 PbO<br>49.2 $TiO_2$ | $1 \times 10^{11}$ | 276 | 40.6 | 1130 | 0.9 | 6.5 | −5 |
| Ref. Ex. 9 | 0.5 $Nd_2O_3$<br>0.3 $In_2O_3$<br>0.2 $MnO_2$<br>49.7 PbO<br>48.3 $TiO_2$ | $7 \times 10^{11}$ | 175 | 43.8 | 950 | — | 18.5 | — |
| Ref. Ex. 10 | 1.0 $Nd_2O_3$<br>0.8 $In_2O_3$<br>0.2 $MnO_2$<br>43.6 PbO<br>51.2 $TiO_2$ | $1 \times 10^{11}$ | 200 | 38.1 | 680 | — | 23 | — |
| Ex. 42 | 3.7 $Nd_2O_3$<br>1.0 $In_2O_3$<br>0.5 $MnO_2$<br>42.7 PbO<br>52.6 $TiO_2$ | $1 \times 10^{11}$ | 322 | 40.5 | 650 | 0.8 | 8.0 | 22 |
| Ex. 43 | 3.7 $Nd_2O_3$<br>0.5 $In_2O_3$<br>0.5 $MnO_2$<br>42.5 PbO<br>52.8 $TiO_2$ | $8 \times 10^{10}$ | 343 | 39.4 | 620 | 0.7 | 7.4 | 31 |
| Ref. Ex. 11 | 3.7 $Nd_2O_3$<br>0.5 $In_2O_3$<br>0.5 $MnO_2$<br>42.7 PbO | $8 \times 10^{10}$ | 341 | 35.8 | 640 | 0.3 | — | — |

TABLE 2-continued

| | Composition | Electric resistance $\rho(\Omega \cdot cm)$ | Dielectric constant $\epsilon_{33}^T$ | Electro-mechanical coupling factor $k_t$ (%) | Mechanical quality factor $Q_M$ | Coupling factor for surface acoustic waves $k_s^2$ (%) | Propagation loss of surface acoustic waves (dB/cm, 60 MHz) | Temperature coefficient of delay of surface acoustic waves (ppm/°C.) |
|---|---|---|---|---|---|---|---|---|
| Ex. 44 | 53.1 TiO$_2$<br>3.7 Nd$_2$O$_3$<br>0.3 In$_2$O$_3$<br>0.2 MnO$_2$<br>43.2 PbO | 6 × 10$^{10}$ | 348 | 39.1 | 600 | 0.8 | 7.4 | 38 |
| Ref. Ex. 12 | 53.4 TiO$_2$<br>2.6 Nd$_2$O$_3$<br>0.5 In$_2$O$_3$<br>0.3 MnO$_2$<br>46.8 PbO | 3 × 10$^{11}$ | 247 | 33.4 | 950 | 0.2 | — | — |
| Ex. 45 | 45.2 TiO$_2$<br>3.7 Nd$_2$O$_3$<br>3.3 In$_2$O$_3$<br>1.0 MnO$_2$<br>47.0 PbO | 8 × 10$^{10}$ | 270 | 40.2 | 1160 | 0.8 | 7.6 | −2 |
| Ref. Ex. 13 | 45.0 TiO$_2$<br>3.7 Nd$_2$O$_3$<br>3.3 In$_2$O$_3$<br>1.0 MnO$_2$<br>45.3 PbO | 7 × 10$^{10}$ | 263 | 39.6 | 1050 | — | 21.0 | — |
| Ref. Ex. 14 | 46.4 TiO$_2$<br>4.0 Nd$_2$O$_3$<br>3.3 In$_2$O$_3$<br>1.0 MnO$_2$<br>45.3 PbO | 3 × 10$^{10}$ | 352 | 36.2 | 720 | 0.2 | — | — |
| Ref. Ex. 15 | 48.7 TiO$_2$<br>4.0 Nd$_2$O$_3$<br>1.0 In$_2$O$_3$<br>1.0 MnO$_2$<br>49.7 PbO | 2 × 10$^{10}$ | 405 | 32.6 | 530 | 0.1 | — | — |
| Ref. Ex. 16 | 49.5 TiO$_2$<br>0.3 Nd$_2$O$_3$<br>0.3 In$_2$O$_3$<br>0.2 MnO$_2$<br>45.6 PbO | 8 × 10$^{11}$ | 164 | 43.7 | 1050 | — | 23 | — |
| Ref. Ex. 17 | 46.6 TiO$_2$<br>3.7 Nd$_2$O$_3$<br>3.6 In$_2$O$_3$<br>0.5 MnO$_2$<br>45.3 PbO | 2 × 10$^{11}$ | 258 | 39.6 | 850 | — | 19 | — |
| Ref. Ex. 18 | 50.8 TiO$_2$<br>2.7 Nd$_2$O$_3$<br>0.2 In$_2$O$_3$<br>1.0 MnO$_2$<br>47.4 PbO | 7 × 10$^{10}$ | 276 | 40.8 | 1260 | 0.9 | 6.5 | 20 |
| Ex. 46 | 47.4 TiO$_2$<br>2.1 Nd$_2$O$_3$<br>1.6 In$_2$O$_3$<br>1.5 MnO$_2$<br>46.9 PbO | 8 × 10$^{10}$ | 214 | 40.1 | 2420 | 0.8 | 5.8 | 28 |
| Ref. Ex. 19 | 48.0 TiO$_2$<br>2.1 Nd$_2$O$_3$<br>1.0 In$_2$O$_3$<br>2.0 MnO$_2$<br>47.4 PbO | 8 × 10$^9$ | 267 | 32.1 | 2530 | 0.1 | — | — |
| Ref. Ex. 20 | 48.9 TiO$_2$<br>2.1 Nd$_2$O$_3$<br>1.6 In$_2$O$_3$ | 1 × 10$^{11}$ | 210 | 44.5 | 320 | — | 19 | — |

As apparent from Examples 20 to 41, in the piezoelectric ceramics of this invention in which In$_2$O$_3$ is added, the electromechanical coupling factor $k_s$ for surface acoustic waves has a value of 0.9–2.4%, and the propagation loss is 4–7 dB/cm in a 60 MHz band, this value being very small as piezoelectric ceramics. The temperature coefficient of delay decreases noticeably with increase in the quantity of addition of Nd$_2$O$_3$ and In$_2$O$_3$, and the zero temperature coefficient is realized as indicated in Example 32 by selecting the compounding composition. Besides, since the dielectric constant is as small as 170–300, the piezoelectric ceramics can endure use at a high frequency. That is, the piezoelectric ceramics of this invention has more excellent properties having heretofore been unattainable as piezoelectric ceramics especially for a surface acoustic wave device owing to the addition of a suitable amount of In$_2$O$_3$.

Reference Examples 9 and 10 correspond to a case where the content of PbO exceeded 49.5%. In this case, the grain growth in the sintering process became conspicuous, and the propagation loss exhibited as large a value as approximately 20 dB/cm at 60 MHz. Examples 42 and 43 and Reference Example 11 correspond to a case where conversely the content of PbO was made small. As the content decreased, the electromechanical coupling factor lowered, and when it was less than 42.7 mol-%, the coupling factor $k_s^2$ for surface acoustic waves became as very small as 0.3%. Example 44 and Reference Example 12 correspond to a case where the content of $TiO_2$ was made large. When the content of $TiO_2$ exceeded 53.1 mol-%, the electromechanical coupling factor lowered noticeably. Conversely, when the content of $TiO_2$ became less than 45.2 mol-%, the propagation loss increased noticeably as indicated in Reference Example 13. Reference Examples 14 and 15 correspond to a case where the quantity of addition of $Nd_2O_3$ exceeded 3.7 mol-%, while Reference Example 16 corresponds to a case where it was smaller than 0.5 mol-%. When the quantity of addition of $Nd_2O_3$ became 4.0 mol-%, the specific electric resistance lowered to about $10^{10}\,\Omega\cdot cm$, and the poling became difficult, so that effectively the coupling factors lowered. Further, the dielectric constant exceeded 300. On the other hand, when the quantity of addition of $Nd_2O_3$ became smaller than 0.5 mol-%, ceramics with many pores was produced and the propagation loss increased. Reference Examples 17 and 18 correspond to cases where the quantities of addition of $In_2O_3$ were larger than 3.3 mol-% and smaller than 0.3 mol-% respectively. When the quantity of addition of $In_2O_3$ became 3.6 mol-%, ceramics with many pores was produced, and the propagation loss increased. On the other hand, with the quantity of addition of 0.2 mol-%, apparatus improvements in the temperature characteristics and the piezoelectric property were not noted. Example 46 and Reference Example 19 correspond to a case where the quantity of addition of $MnO_2$ was made large, and Reference Example 20 corresponds to a case where $MnO_2$ was not contained at all. By increasing the quantity of addition of $MnO_2$, the mechanical quality factor $Q_M$ increased remarkably. However, when it exceeded 1.5 mol-%, the electric resistance lowered abruptly, so that the coupling factors became small. In the case where $MnO_2$ was not added at all, ceramics of an extremely small mechanical quality factor was produced, and the propagation loss was large.

As explained above, the piezoelectric ceramics which contains 42.7 to 49.5 mol-% of PbO, 45.2 to 53.1 mol-% of $TiO_2$, 0.5 to 3.7 mol-% of $Nd_2O_3$, 0.3 to 3.3 mol-% of $In_2O_3$ and 0.2 to 1.5 mol-% of $MnO_2$ has the properties being more excellent than those of the foregoing piezoelectric ceramics with no $In_2O_3$ added, as piezoelectric ceramics especially for a surface acoustic wave device.

What is claimed is:

1. Piezoelectric ceramics comprising 42.7 to 49.5 mol-% of PbO, 45.2 to 53.1 mol-% of $TiO_2$, 0.5 to 3.7 mol-% of $Nd_2O_3$, 0.3 to 3.3 mol-% of $In_2O_3$, and 0.2 to 1.5 mol-% of $MnO_2$, the total mol-% of PbO, $TiO_2$, $Nd_2O_3$, $In_2O_3$ and $MnO_2$, being 100 mol-%.

* * * * *